(12) United States Patent
Ito

(10) Patent No.: US 6,624,076 B1
(45) Date of Patent: Sep. 23, 2003

(54) SEMICONDUCTOR DEVICE AND METHOD FOR FABRICATING THE SAME

(75) Inventor: Toyoji Ito, Shiga (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/672,860

(22) Filed: Sep. 29, 2000

(30) Foreign Application Priority Data

Jan. 21, 2000 (JP) ........................................ 2000-012423

(51) Int. Cl.[7] ...................... H01L 21/302; H01L 21/461
(52) U.S. Cl. ...................... 438/689; 438/3; 438/6; 438/239; 438/243; 438/250; 438/694; 438/695; 438/697; 438/306
(58) Field of Search ...................... 438/689, 250–256, 438/3, 6, 238–44, 211, 593, 694–697, 706; 257/295

(56) References Cited

U.S. PATENT DOCUMENTS

| | | | |
|---|---|---|---|
| 5,258,093 A | * 11/1993 | Maniar | 156/626 |
| 5,350,705 A | * 9/1994 | Brassington et al. | 257/295 |
| 5,411,912 A | * 5/1995 | Sakamoto | 437/60 |
| 5,593,914 A | * 1/1997 | Evans, Jr. et al. | 437/60 |
| 5,972,722 A | * 10/1999 | Visokay et al. | 438/3 |
| 6,046,059 A | * 4/2000 | Shen et al. | 438/3 |
| 6,083,788 A | * 7/2000 | Lian et al. | 438/253 |
| 6,097,051 A | * 8/2000 | Torii et al. | 257/306 |
| 6,184,044 B1 | * 2/2001 | Sone et al. | 438/3 |
| 6,207,465 B1 | * 3/2001 | Cuchiaro et al. | 438/3 |
| 6,294,420 B1 | * 9/2001 | Tsu et al. | 438/239 |
| 6,344,389 B1 | * 2/2002 | Bronner et al. | 438/244 |

FOREIGN PATENT DOCUMENTS

| | | | |
|---|---|---|---|
| EP | 0-450-572 A2 * | 9/1991 | ......... H01L/21/285 |
| JP | 64-004049 | 1/1989 | |
| JP | 09-199679 | 7/1997 | |
| JP | 09-232533 | 9/1997 | |
| JP | 11-087633 | 3/1999 | |
| JP | 2000-036586 | 2/2000 | |

OTHER PUBLICATIONS

Onishi et al. "A half–micron ferroelectric memory cell with stacked capacitor structure" IEEE 0–7803–2111–1 IEDM 94 p. 843–46.*

Lee et al. "Characterization and elimination of dry etching damaged layer in pt/pbo/pt ferroelectric capacitor" applied physics letters vol. 75 No. 3 7/99 p. 334–336.*

* cited by examiner

Primary Examiner—Matthew Smith
Assistant Examiner—Granvill D Lee
(74) Attorney, Agent, or Firm—Nixon Peabody LLP; Donald R. Studebaker

(57) ABSTRACT

First, a pattern of electrodes or interconnects is formed on a semiconductor substrate. Next, a first insulating film, which will be dry-etched at a relatively high rate and exhibit relatively high planarity, is deposited over the substrate as well as over the pattern. Subsequently, a second insulating film, which will be dry-etched at a relatively low rate and exhibit relatively low planarity, is deposited over the first insulating film. Thereafter, a multilayer structure, including a ferroelectric film, is formed on the second insulating film and then dry-etched and patterned, thereby forming an electronic device out of the multilayer structure.

7 Claims, 9 Drawing Sheets

SEMICONDUCTOR DEVICE AND METHOD FOR FABRICATING THE SAME

BACKGROUND OF THE INVENTION

The present invention generally relates to a semiconductor device and a method for fabricating the device. More particularly, the present invention relates to a semiconductor device, in which an electronic device has been formed out of a multilayer structure, including a ferroelectric film, on an insulating film deposited over a pattern of electrodes or interconnects, and to a method for fabricating the device.

An electronic device formed out of a multilayer structure including a ferroelectric film, e.g., a ferroelectric capacitor including a capacitive insulating film made of a ferroelectric material, not only has a high dielectric constant but also shows hysteresis with residual electric polarization. Accordingly, in the fields of capacitors with large capacitance and nonvolatile memories, those capacitors including a ferroelectric film have recently been replacing the known capacitors including a capacitive insulating film of silicon dioxide or silicon nitride.

Hereinafter, a known method for fabricating a semiconductor device (which will be herein called a "first prior art example" for convenience sake) will be described with reference to FIGS. 8(a) through 8(e).

First, as shown in FIG. 8(a), an interconnect (or gate electrode) 11 of polysilicon with a thickness of 400 nm, for example, is formed on a semiconductor substrate 10, in which a diffused layer for an MOS transistor, for example, has been defined. Next, a silicon nitride film 12 is deposited to a thickness of 40 nm, for example, over the entire surface of the substrate 10 as well as over the interconnect 11. Then, an interlayer dielectric film 13, which may be a first silicon dioxide film doped with boron and phosphorus, is deposited to a thickness of 1000 nm, for example, over the silicon nitride film 12.

Subsequently, as shown in FIG. 8(b), a resist film 14 is deposited on the interlayer dielectric film 13 so that the surface of the film 14 becomes as flat as possible. Then, the resist film 14 and interlayer dielectric film 13 are etched back, thereby planarizing the surface of the interlayer dielectric film 13 as shown in FIG. 8(c).

Thereafter, as shown in FIG. 8(d), first metal film 14, ferroelectric film 15 and second metal film 16 are deposited in this order on the interlayer dielectric film 13 with the planarized surface. In this case, the first and second metal films 14 and 16 may be both made of platinum. Examples of known techniques for depositing the ferroelectric film 15 include sputtering, metalorganic chemical vapor deposition (MOCVD) and spin coating. Among these techniques, the spin coating technique is advantageous in uniformity of film thickness and quality, stability of conditions and productivity. In a spin coating process, the ferroelectric film 15 is formed by coating the surface of an underlying layer with an organometallic solution, containing the constituent metal of the ferroelectric film 15, using a coater, and then annealing and crystallizing the resultant coating at an elevated temperature. In this process, the coating is formed using a coater. Thus, the thickness of the resultant ferroelectric film 15 is much affected by the unevenness of the underlying layer. Specifically, part of the ferroelectric film 15, covering the upper corners of a stepped portion, will be relatively thin, while another part of the ferroelectric film 15, covering the lower corners of the stepped portion will be relatively thick. Accordingly, to uniformize the thickness of the ferroelectric film 15, the surface of the interlayer dielectric film 13 should be as flat as possible.

Next, as shown in FIG. 8(e), the second metal film 16, ferroelectric film 15 and first metal film 14 are dry-etched and patterned in this order, thereby forming a capacitor made up of upper electrode 16A, capacitive insulating film 15A and lower electrode 14A. In this step, parts of the interlayer dielectric film 13, on which the capacitor does not exist, is over-etched through the dry etching process. As a result, a patterned interlayer dielectric film 13A is obtained.

Subsequently, although not shown, a second silicon dioxide film is deposited to a thickness of 200 nm, for example, over the entire surface of the semiconductor substrate 10 as well as over the respective regions where the MOS transistor and the capacitor will be formed. Then, a contact hole is opened through respective parts of the second silicon dioxide film and the patterned interlayer dielectric film 13A, in which the MOS transistor will be formed. Thereafter, the contact hole is filled in with a conductor film, thereby forming a contact connected to the MOS transistor.

The multilayer structure, consisting of the second metal film 16, ferroelectric film 15 and first metal film 14, includes the ferroelectric film 15, which is dry-etched at a low rate because the film 15 contains a metal that has a high melting point. Accordingly, the multilayer structure is also dry-etched at a relatively low rate. In other words, the dry-etch selectivity of the multilayer structure to the interlayer dielectric film 13 becomes low.

Thus, in the dry etching process for forming a capacitor made up of the upper electrode 16A, capacitive insulating film 15A and lower electrode 14A, the interlayer dielectric film 13 is over-etched so deep, except for its part on which the capacitor will be formed. As a result, the interconnect 11 is also partially etched away unintentionally as shown in FIG. 8(e). Particularly if some dopants such as boron and phosphorus have been added to the silicon dioxide film to further planarize the interlayer dielectric film 13 by a reflow process, the dry-etch rate of the interlayer dielectric film 13 will further increase. That is to say, the etch selectivity of the multilayer structure to the interlayer dielectric film 13 will further decrease in that case. Consequently, the above problem will get even more noticeable.

To solve such a problem, an alternative method for fabricating a semiconductor device (which will herein be called a "second prior art example" for convenience sake) was suggested. Hereinafter, this method will be briefly described with reference to FIGS. 9(a) through 9(c).

Specifically, a relatively thick interlayer dielectric film 13, which is a silicon dioxide film containing boron and phosphorus, is deposited to a thickness of about 1500 nm, for example, over the silicon nitride film 12 and then has its surface planarized as shown in FIG. 9(a). Next, as shown in FIG. 9(b), the first metal film 14, ferroelectric film 15 and second metal film 16 are deposited in this order on the interlayer dielectric film 13 with the planarized surface. Then, the second metal film 16, ferroelectric film 15 and first metal film 14 are dry-etched and patterned in this order, thereby forming a capacitor consisting of the upper electrode 16A, capacitive insulating film 15A and lower electrode 14A as shown in FIG. 9(c). According to this alternative method, the interlayer dielectric film 13 also has its thickness reduced or over-etched, except for its part on which the capacitor will be formed, during the dry etching process. As a result, a patterned interlayer dielectric film 13B is obtained.

In this second prior art example, however, the interlayer dielectric film 13 is relatively thick, so is the patterned interlayer dielectric film 13B. Thus, a contact hole to be formed in that interlayer dielectric film 13B will have a greater aspect ratio. In that case, the metal film to fill the contact hole will have decreased step coverage, i.e., the contact hole cannot be covered with a metal film satisfactorily. As a result, problems of different types, e.g., disconnection or increase in contact resistance, newly arise. Accordingly, it is not preferable to increase the thickness of the interlayer dielectric film 13 excessively.

SUMMARY OF THE INVENTION

It is therefore an object of the present invention to prevent electrodes or interconnects, which are located under an interlayer dielectric film, from being exposed even if the interlayer dielectric film, deposited under a multilayer structure including a ferroelectric film, has its thickness reduced.

To achieve the above object, a first inventive method for fabricating a semiconductor device includes the steps of: a) forming a pattern of electrodes or interconnects on a semiconductor substrate; b) depositing a first insulating film, which will be dry-etched at a relatively high rate and exhibit relatively high planarity, over the substrate as well as over the pattern; c) depositing a second insulating film, which will be dry-etched at a relatively low rate and exhibit relatively low planarity, over the first insulating film; and d) forming a multilayer structure, including a ferroelectric film, on the second insulating film and then dry-etching and patterning the multilayer structure, thereby forming an electronic device out of the multilayer structure.

According to the first method, the first insulating film, which will exhibit relatively high planarity, is deposited over the substrate as well as over the pattern. Thus, the surface of the first insulating film is sufficiently flat and is not affected so much by the unevenness of the pattern located under the first insulating film.

Also, the second insulating film, which will be dry-etched at a relatively low rate, is deposited on the first insulating film, which will be dry-etched at a relatively high rate. Then, the multilayer structure, including the ferroelectric film, is formed on the second insulating film and then dry-etched and patterned, thereby forming the electronic device out of the multilayer structure. Accordingly, the ratio of the dry-etch rate of the multilayer structure to that of the second insulating film increases. That is to say, the dry-etch selectivity of the multilayer structure to the second insulating film gets high, so the second insulating film is harder to etch. Thus, even if the total thickness of the interlayer dielectric film, consisting of the first and second insulating films, is reduced, the pattern of electrodes or interconnects is not exposed.

In one embodiment of the present invention, the first method preferably further includes the steps of: depositing a wet-etch stopper over the pattern between the steps a) and b); and wet-etching the first insulating film to reduce the thickness of the first insulating film between the steps b) and c).

As described above, in a dry etching process carried out to form an electronic device (e.g., a capacitor), the interlayer dielectric film is often over-etched. That is to say, a big level difference is created between a part of the interlayer dielectric film on which the electronic device (or capacitor) will be formed and the other parts thereof (e.g., a part in which an MOS transistor will be formed). Accordingly, when a lithographic process is carried out to define interconnects on the interlayer dielectric film, a focus error is likely to occur. As a result, several interconnects might be bridged together unintentionally or some interconnects might be disconnected.

However, if the second insulating film is deposited after the first insulating film has been wet-etched to reduce the thickness thereof, then the level difference between the part of the interlayer dielectric film on which the electronic device will be formed and the other parts thereof will decrease. Accordingly, in the lithographic process for defining interconnects on the interlayer dielectric film, a focus error is much less likely to occur. As a result, almost no interconnects will be neither bridged together nor disconnected unintentionally.

In another embodiment, the first method preferably further includes the steps of: depositing a wet-etch stopper over the pattern between the steps a) and b); and wet-etching and removing parts of the second insulating film, on which the electronic device does not exist, after the step d) has been performed.

By wet-etching and removing parts of the second insulating film, on which the electronic device does not exist, part of the interlayer dielectric film (consisting of the first and second insulating films), on which the electronic device does not exist (e.g., a part in which an MOS transistor will be formed) can have its thickness further reduced. Thus, the aspect ratio of a contact hole, which will be formed in the interlayer dielectric film, can be reduced and the step coverage for the contact hole can be further improved.

In still another embodiment, the first insulating film is preferably a first silicon dioxide film containing a dopant, while the second insulating film is preferably a second silicon dioxide film containing substantially no dopants.

A second inventive method for fabricating a semiconductor device includes the steps of: forming a pattern of electrodes or interconnects on a semiconductor substrate; depositing a wet-etch stopper film over the substrate as well as over the pattern; depositing an insulating film over the wet-etch stopper film; forming a multilayer structure, including a ferroelectric film, on the insulating film and then dry-etching and patterning the multilayer structure, thereby forming an electronic device out of the multilayer structure; and selectively wet-etching the insulating film so that parts of the insulating film, on which the electronic device does not exist, will have a reduced thickness.

The second method includes the step of selectively wet-etching parts of the insulating film, on which the electronic device does not exist, to reduce the thickness of those parts. Accordingly, the insulating film can have its thickness reduced without damaging the pattern of electrodes or interconnects.

In one embodiment of the present invention, the insulating film preferably includes a silicon dioxide film containing a dopant.

In the first or second method of the present invention, the electronic device may be a capacitor including a capacitive insulating film that has been formed out of the ferroelectric film.

A first inventive semiconductor device includes: a pattern of electrodes or interconnects formed on a semiconductor substrate; a first insulating film deposited over the substrate as well as over the pattern, the first insulating film having been dry-etched at a relatively high rate and exhibiting relatively high planarity; a second insulating film deposited over the first insulating film, the second insulating film having been dry-etched at a relatively low rate and exhibiting relatively low planarity; and an electronic device formed on a part of the second insulating film, under which the pattern does not exist, out of a multilayer structure including a ferroelectric film.

In the first semiconductor device, the first insulating film, exhibiting relatively high planarity, has been deposited over the substrate as well as over the pattern. Thus, the surface of the first insulating film is sufficiently flat and is not affected so much by the unevenness of the pattern located under the first insulating film.

Also, the second insulating film, which has been dry-etched at a relatively low rate, is deposited on the first insulating film, which was dry-etched at a relatively high rate. And the electronic device has been formed on the second insulating film out of the multilayer structure including the ferroelectric film. Accordingly, the ratio of the dry-etch rate of the multilayer structure to that of the second insulating film increases. That is to say, the dry-etch selectivity of the multilayer structure to the second insulating film gets high, so the second insulating film is harder to etch. Thus, even if the total thickness of the interlayer dielectric film, consisting of the first and second insulating films, is reduced, the pattern of electrodes or interconnects is not exposed.

In one embodiment of the present invention, parts of the second insulating film, on which the electronic device does not exist, have preferably been wet-etched and removed.

In such an embodiment, the part of the interlayer dielectric film (consisting of the first and second insulating films), on which the electronic device does not exist (e.g., a part in which an MOS transistor will be formed) can have its thickness further reduced. Thus, the aspect ratio of a contact hole, which will be formed in the interlayer dielectric film, can be reduced and the step coverage for the contact hole can be further improved.

In another embodiment of the present invention, the first insulating film is preferably a first silicon dioxide film containing a dopant, while the second insulating film is preferably a second silicon dioxide film containing substantially no dopants.

A second inventive semiconductor device includes: a pattern of electrodes or interconnects formed on a semiconductor substrate; an insulating film deposited over the substrate as well as over the pattern; and an electronic device formed on a part of the insulating film, under which the pattern does not exist, out of a multilayer structure including a ferroelectric film. In the second inventive device, parts of the insulating film, on which the electronic device does not exist, have been wet-etched and removed.

In the second semiconductor device, parts of the insulating film, on which the electronic device does not exist, have been wet-etched and removed to reduce the thickness thereof. Thus, the thickness of the insulating film can be reduced without damaging the pattern of electrodes or interconnects.

In one embodiment of the present invention, the insulating film preferably includes a silicon dioxide film containing a dopant.

In the first or second semiconductor device, the electronic device may be a capacitor including a capacitive insulating film that has been formed out of the ferroelectric film.

DESCRIPTION OF THE PREFERRED EMBODIMENTS

EMBODIMENT 1

Figure 1A:
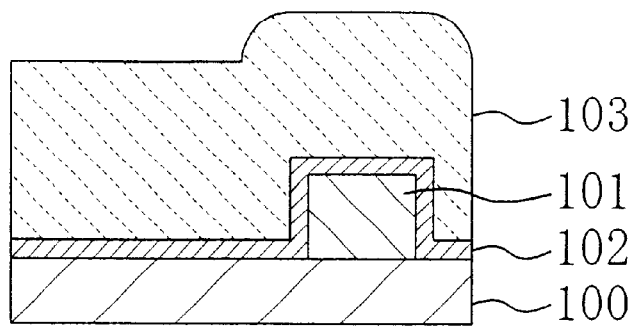
FIGS. 1(*a*), 1(*b*), 1(*c*), 1(*d*), 2(*a*), 2(*b*), 2(*c*) and 2(*d*) are cross-sectional views illustrating respective process steps for fabricating a semiconductor device according to a first embodiment of the present invention.
Figure 1B:
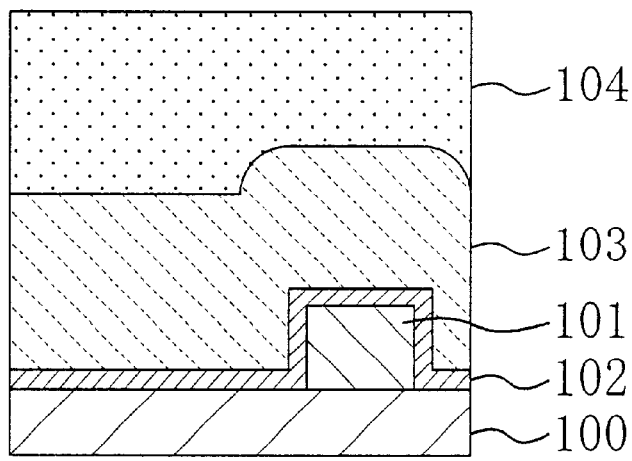
Figure 1C:
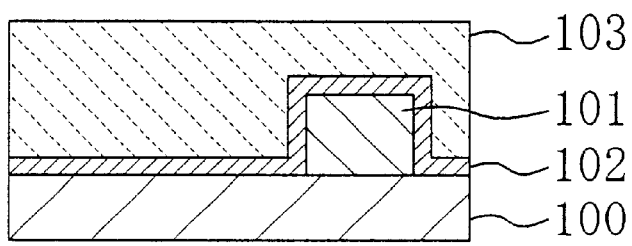
Figure 1D:
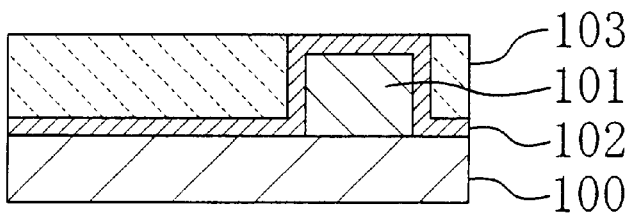
Figure 2A:
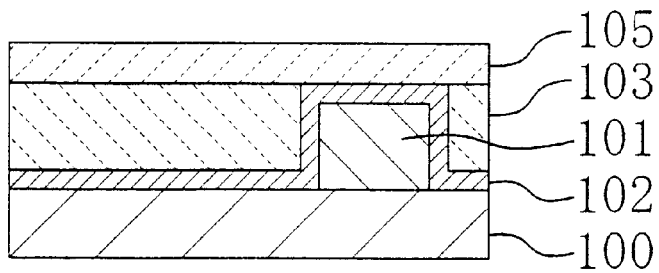
Figure 2B:
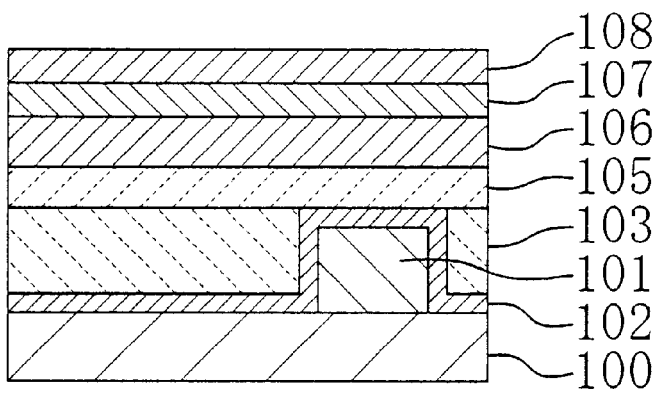
Figure 2C:
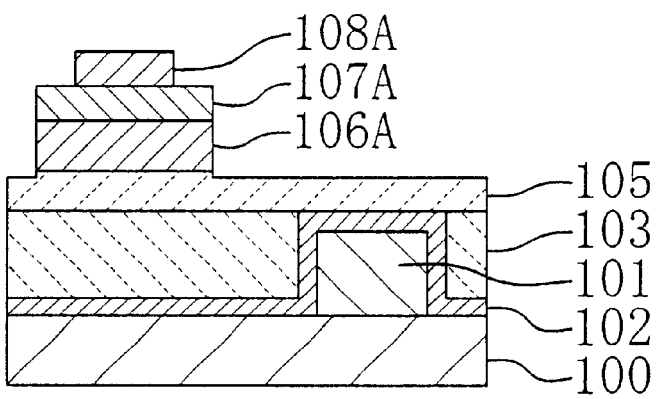
Figure 2D:
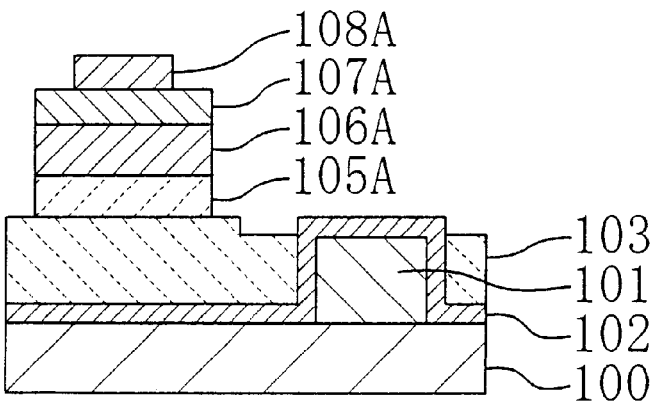

Hereinafter, a semiconductor device and its fabrication process according to a first embodiment of the present invention will be described with reference to FIGS. 1(*a*) through 2(*d*).

First, as shown in FIG. 1(*a*), an interconnect (or gate electrode) 101 of polysilicon with a thickness of 400 nm, for example, is formed by a known technique on a semiconductor substrate 100, in which a diffused layer and so on for an MOS transistor have been defined. Next, a silicon nitride film 102, which will be a wet-etch stopper film, is deposited by a CVD process, for instance, to a thickness of 40 nm, for example, over the entire surface of the substrate 100. Then, a first silicon dioxide film 103, which contains boron and phosphorus, is deposited by a CVD process, for instance, to a thickness of 1000 nm, for example, over the silicon nitride film 102. Thereafter, the first silicon dioxide film 103 is subjected to a reflow process at 850° C. within a nitrogen gas ambient, for example. In this case, the first silicon dioxide film 103 can have its surface planarized sufficiently, because the film 103 contains boron and phosphorus and easily softens and flows with heat. However, part of the first silicon dioxide film 103 over the interconnect 101 still protrudes slightly and forms a gently stepped portion.

Subsequently, as shown in FIG. 1(*b*), a resist film 104 is deposited to a thickness of 1500 nm, for example, on the first silicon dioxide film 103 so that the surface of the film 104 becomes as flat as possible. Then, the resist film 104 and the first silicon dioxide film 103 are dry-etched and etched back, thereby planarizing the surface of the first silicon dioxide film 103 as shown in FIG. 1(*c*).

Thereafter, the first silicon dioxide film 103 is wet-etched with a hydrofluoric acid solution, thereby exposing the silicon nitride film 102 over the interconnect 101 as shown in FIG. 1(*d*). As a result, the surface of the first silicon dioxide film 103 is leveled with that of the silicon nitride film 102 over the interconnect 101.

Next, as shown in FIG. 2(*a*), a second silicon dioxide film 105, which contains substantially no dopants like boron or phosphorus, is deposited by a CVD process, for instance, to a thickness of 200 nm, for example, over the first silicon dioxide film 103. The first and second silicon dioxide films 103 and 105 together make an interlayer dielectric film.

Then, as shown in FIG. 2(*b*), a first metal film 106, e.g., platinum film, is deposited by a sputtering process, for instance, to a thickness of 300 nm, for example, over the second silicon dioxide film 105. Next, a ferroelectric film 107, containing strontium, bismuth, tantalum, and so on, is formed by a spin coating process, for instance, to a thickness of 200 nm, for example, over the first metal film 106. Thereafter, the ferroelectric film 107 is annealed and crystallized at 800° C. within an oxygen ambient, for example. Subsequently, a second metal film 108, e.g., platinum film, is deposited by a sputtering process, for instance, to a thickness of 200 nm, for example, over the ferroelectric film 107.

Next, as shown in FIG. 2(*c*), the second metal film 108, ferroelectric film 107 and first metal film 106 are dry-etched and patterned in this order, thereby forming a capacitor made up of upper electrode 108A, capacitive insulating film 107A and lower electrode 106A. In this process step, the first metal film 106 is preferably dry-etched so that the etch selectivity of the first metal film 106 to the second silicon dioxide film 105 will be high.

Thereafter, a mask pattern (not shown), covering a region where the capacitor has been formed, is defined to mask and selectively wet-etch the second silicon dioxide film 105 using a hydrofluoric acid solution. As a result, parts of the first silicon dioxide film 103, on which the capacitor does not exist (e.g., a part in which an MOS transistor will be formed), have been removed and the silicon nitride film 102 is partially exposed as shown in FIG. 2(*d*).

Subsequently, although not shown, a third silicon dioxide film is deposited to a thickness of 200 nm, for example, over the entire surface of the semiconductor substrate 100 as well as over the respective regions where the MOS transistor and the capacitor are located. Then, a contact hole is opened through respective parts of the third silicon dioxide film and the first silicon dioxide film 103, in which the transistor will be formed. Thereafter, the contact hole is filled in with a conductor film, thereby forming a contact connected to the diffused region of the MOS transistor.

According to the first embodiment, the first silicon dioxide film 103 contains boron and phosphorus and can have its surface sufficiently planarized by a reflow process. Thus, the surface of the first silicon dioxide film 103 will be sufficiently flat and is not affected so much by the unevenness of the interconnect 101 located under the first silicon dioxide film 103.

Also, according to the first embodiment, in forming the capacitor consisting of the upper and lower electrodes 108A and 106A and capacitive insulating film 107A by dry-etching and patterning the second metal, ferroelectric and first metal films 108, 107 and 106, the second silicon dioxide film 105 exists under the first metal film 106. The second silicon dioxide film 105 contains substantially no boron or phosphorus and the dry-etch rate of the second silicon dioxide film 105 is low. Accordingly, even if the second silicon dioxide film 105 has been over-etched, the interconnect 101 will not be damaged by the etching process.

Furthermore, according to the first embodiment, the first silicon dioxide film 103 is wet-etched with a hydrofluoric acid solution to remove a part of the first silicon dioxide film 103 in which an MOS transistor will be formed. Thus, the silicon nitride film 102 can be a wet-etch stopper, because the film 102 is not etched by hydrofluoric acid easily. As a result, the interconnect 101 is not likely to be damaged, either. In the wet etching process using hydrofluoric acid, the wet-etch rate of the first silicon dioxide film 103 is about 80 times as high as that of the silicon nitride film 102.

EMBODIMENT 2

Hereinafter, a semiconductor device and its fabrication process according to a second embodiment of the present invention will be described with reference to FIGS. 3(*a*) through 5(*c*).

Figure 3A:
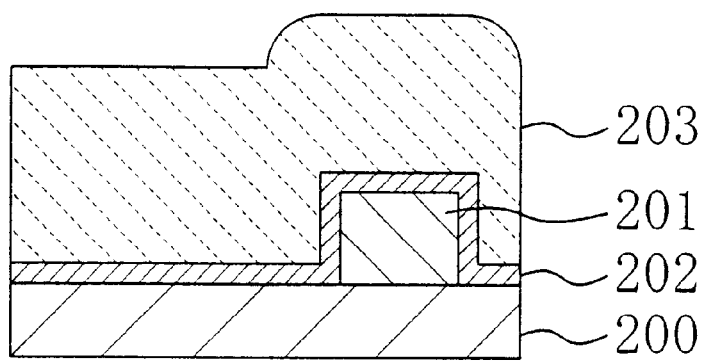
FIGS. 3(*a*), 3(*b*), 3(*c*), 4(*a*), 4(*b*), 4(*c*), 5(*a*), 5(*b*) and 5(*c*) are cross-sectional views illustrating respective process steps for fabricating a semiconductor device according to a second embodiment of the present invention.
Figure 3B:
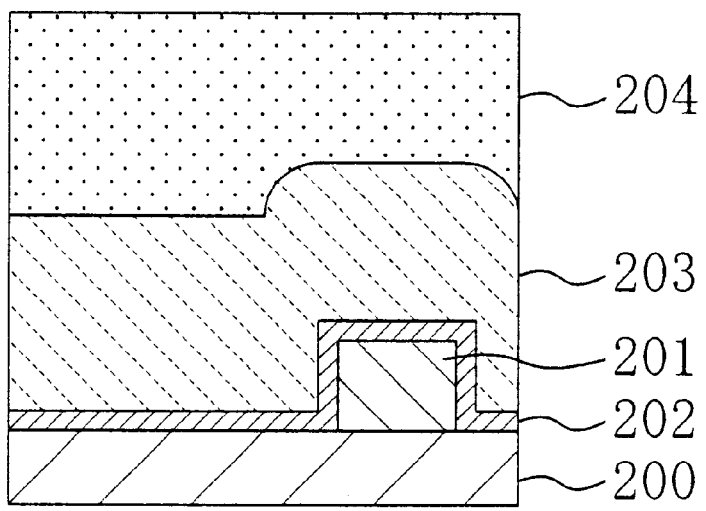
Figure 3C:
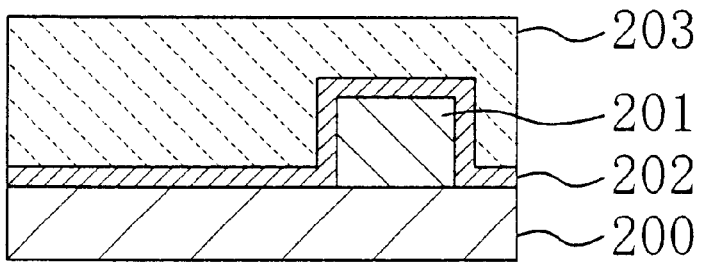

First, as shown in FIG. 3(*a*), an interconnect (or gate electrode) 201 of polysilicon with a thickness of 400 nm, for example, is formed by a known technique on a semiconductor substrate 200, in which a diffused layer and so on for an MOS transistor have been defined. Next, a silicon nitride film 202, which will be a wet-etch stopper film, is deposited by a CVD process, for instance, to a thickness of 40 nm, for example, over the entire surface of the substrate 200. Then, a first silicon dioxide film 203, which contains boron and phosphorus, is deposited by a CVD process, for instance, to a thickness of 1000 nm, for example, over the silicon nitride film 202. Thereafter, the first silicon dioxide film 203 is subjected to a reflow process at 850° C. within a nitrogen gas ambient, for example. In this case, the first silicon dioxide film 203 can have its surface planarized sufficiently, because the film 203 contains boron and phosphorus and softens and flows easily with heat. However, part of the first silicon dioxide film 203 over the interconnect 201 still protrudes slightly and forms a gently stepped portion.

Subsequently, as shown in FIG. 3(*b*), a resist film 204 is deposited to a thickness of 1500 nm, for example, over the first silicon dioxide film 203 so that the surface of the film 204 becomes as flat as possible. Then, the resist film 204 and the first silicon dioxide film 203 are dry-etched and etched back, thereby planarizing the surface of the first silicon dioxide film 203 as shown in FIG. 3(*c*).

Figure 4A:
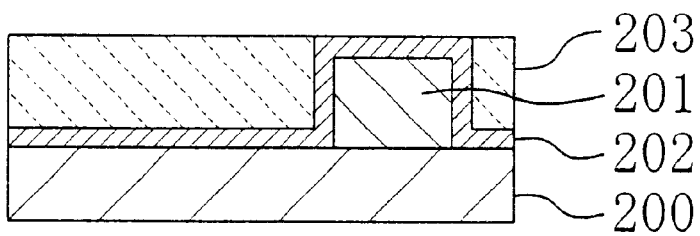
Figure 4B:
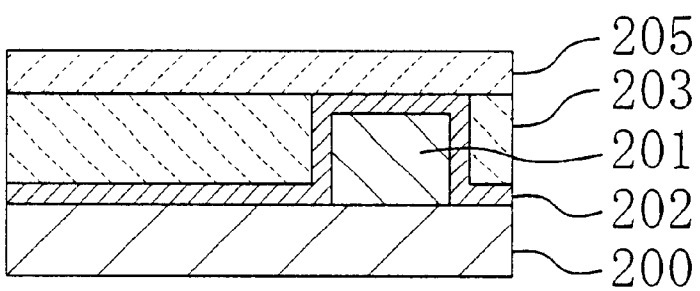
Figure 4C:
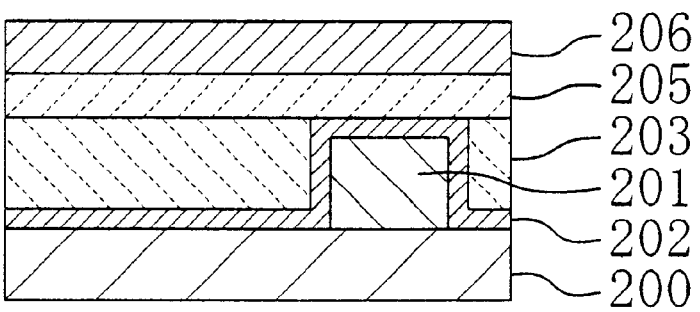

Thereafter, the first silicon dioxide film 203 is wet-etched with a hydrofluoric acid solution, thereby exposing the silicon nitride film 202 over the interconnect 201 as shown in FIG. 4(*a*). As a result, the surface of the first silicon dioxide film 203 is leveled with that of the silicon nitride film 202 over the interconnect 201.

Next, as shown in FIG. 4(*b*), a second silicon dioxide film 205, which contains substantially no dopants like boron or phosphorus, is deposited by a CVD process, for instance, to a thickness of 200 nm, for example, over the first silicon dioxide film 203. The first and second silicon dioxide films 203 and 205 together make an interlayer dielectric film.

Then, as shown in FIG. 4(*c*), a first metal film 206, e.g., platinum film, is deposited by a sputtering process, for instance, to a thickness of 300 nm, for example, over the second silicon dioxide film 205. And the first metal film 206 is patterned into a lower electrode 206A as shown in FIG. 5(*a*).

Figure 5A:
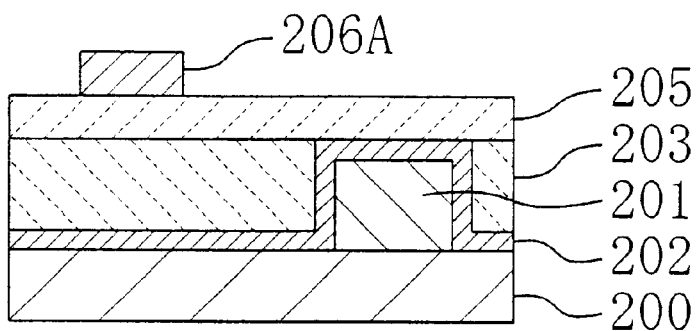
Figure 5B:
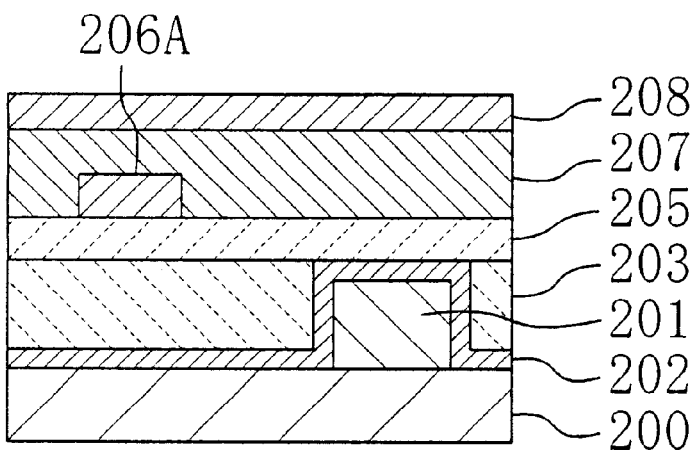
Figure 5C:
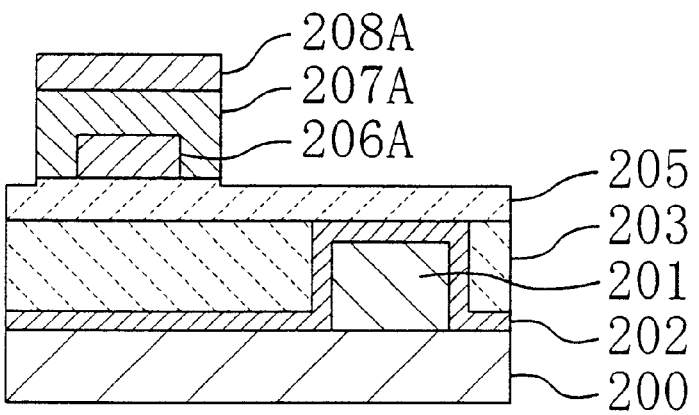

Next, as shown in FIG. 5(*b*), a ferroelectric film 207, containing strontium, bismuth, tantalum, and so on, is formed by a spin coating process, for instance, over the second silicon dioxide film 205 as well as over the lower electrode 206A. In this case, part of the ferroelectric film 207, which is located over the lower electrode 206A, has a thickness of 200 nm, for example. Thereafter, the ferroelectric film 207 is annealed and crystallized at 800° C. within an oxygen ambient, for example. Subsequently, a second metal film 208, e.g., platinum film, is deposited by a sputtering process, for instance, to a thickness of 200 nm, for example, on the ferroelectric film 207.

Next, as shown in FIG. 5(*c*), the second metal film 208 and ferroelectric film 207 are dry-etched and patterned in this order, thereby forming an upper electrode 208A and a capacitive insulating film 207A. In this process step, the ferroelectric film 207 is preferably dry-etched so that the dry-etch selectivity of the ferroelectric film 207 to the second silicon dioxide film 205 will be high.

Subsequently, although not shown, a third silicon dioxide film is deposited to a thickness of 200 nm, for example, over the entire surface of the semiconductor substrate 200 as well as over the respective regions where the MOS transistor and the capacitor are located. Then, a contact hole is opened through respective parts of the first and second silicon dioxide films 203 and 205 and third silicon dioxide film, in which the MOS transistor will be formed. Thereafter, the contact hole is filled in with a conductor film, thereby forming a contact connected to the diffused region of the MOS transistor.

According to the second embodiment, the first silicon dioxide film 203 contains boron and phosphorus and can have its surface sufficiently planarized by a reflow process. Thus, the surface of the first silicon dioxide film 203 will be sufficiently flat and is not affected so much by the unevenness of the interconnect 201 located under the first silicon dioxide film 203.

Also, according to the second embodiment, in forming a capacitor consisting of the upper and lower electrodes 208A and 206A and capacitive insulating film 207A by dry-etching and patterning the second metal film 208 and ferroelectric film 207, the second silicon dioxide film 205, which contains substantially no boron or phosphorus and will be dry-etched at a relatively low rate, exists under the lower electrode 206A. Accordingly, even if the second silicon dioxide film 205 has been over-etched, the interconnect 201 will not be damaged by the etching process.

EMBODIMENT 3

Hereinafter, a semiconductor device and its fabrication process according to a third embodiment of the present invention will be described with reference to FIGS. 6(a) through 7(c).

Figure 6A:
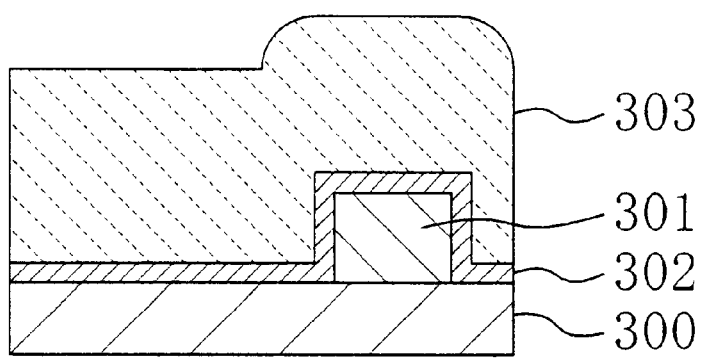
FIGS. 6(*a*), 6(*b*), 6(*c*), 7(*a*), 7(*b*) and 7(*c*) are cross-sectional views illustrating respective process steps for fabricating a semiconductor device according to a third embodiment of the present invention.

First, as shown in FIG. 6(a), an interconnect (or gate electrode) 301 of polysilicon with a thickness of 400 nm, for example, is formed by a known technique on a semiconductor substrate 300, in which a diffused layer and so on for an MOS transistor have been defined. Next, a silicon nitride film 302, which will be a wet-etch stopper film, is deposited by a CVD process, for instance, to a thickness of 40 nm, for example, over the entire surface of the substrate 300. Then, a first silicon dioxide film 303, which contains boron and phosphorus, is deposited by a CVD process, for instance, to a thickness of 1500 nm, for example, over the silicon nitride film 302. Thereafter, the first silicon dioxide film 303 is subjected to a reflow process at 850° C. within a nitrogen gas ambient, for example. In this case, the first silicon dioxide film 303 can have its surface planarized sufficiently, because the film 303 contains boron and phosphorus. However, part of the first silicon dioxide film 303 over the interconnect 301 still protrudes slightly and forms a gently stepped portion. It should be noted that the thickness of the first silicon dioxide film 303 is preferably in the range from 1000 to 2000 nm.

Figure 6B:
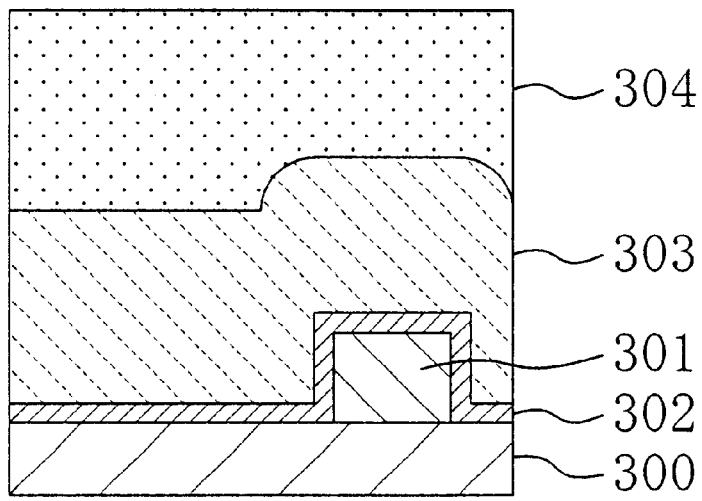
Figure 6C:
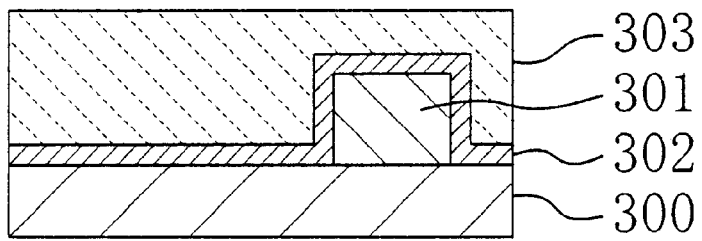

Subsequently, as shown in FIG. 6(b), a resist film 304 is deposited to a thickness of 1500 nm, for example, over the first silicon dioxide film 303 so that the surface of the film 304 becomes as flat as possible. Then, the resist film 304 and the first silicon dioxide film 303 are dry-etched and etched back, thereby planarizing the surface of the first silicon dioxide film 303 as shown in FIG. 6(c). In the third embodiment, the first silicon dioxide film 303 alone makes an interlayer dielectric film.

Figure 7A:
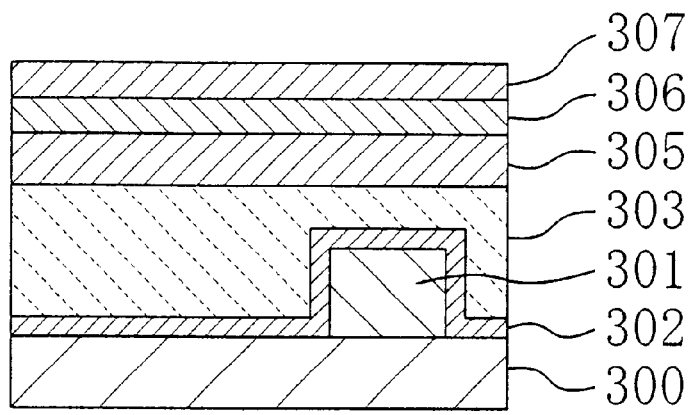

Then, as shown in FIG. 7(a), a first metal film 305, e.g., platinum film, is deposited by a sputtering process, for instance, to a thickness of 300 nm, for example, over the first silicon dioxide film 303. Next, a ferroelectric film 306, containing strontium, bismuth, tantalum, and so on, is formed by a spin coating process, for instance, to a thickness of 200 nm, for example, over the first metal film 305. Thereafter, the ferroelectric film 306 is annealed and crystallized at 800° C within an oxygen ambient, for example. Subsequently, a second metal film 307, e.g., platinum film, is deposited by a sputtering process, for instance, to a thickness of 200 nm, for example, on the ferroelectric film 306.

Figure 7B:
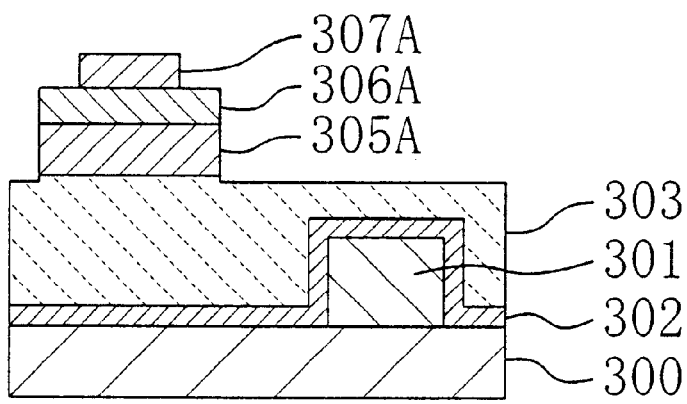

Next, as shown in FIG. 7(b), the second metal film 307, ferroelectric film 306 and first metal film 305 are patterned in this order, thereby forming a capacitor made up of upper electrode 307A, capacitive insulating film 306A and lower electrode 305A. In this embodiment, the first silicon dioxide film 303 is relatively thick. Accordingly, even after the capacitor is formed by this dry-etching process, part of the silicon nitride film 302, located over the interconnect (or gate electrode) 301, is not etched.

Figure 7C:
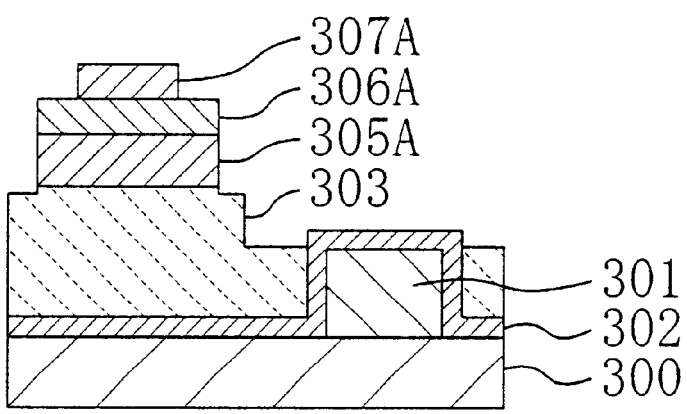
Figure 8A:
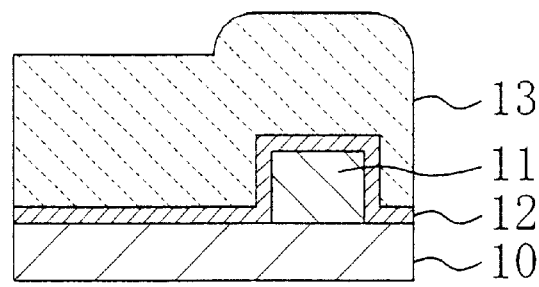
FIGS. 8(*a*), 8(*b*), 8(*c*), 8(*d*) and 8(*e*) are cross-sectional views illustrating respective process steps for fabricating a semiconductor device according to a first prior art example.
Figure 8B:
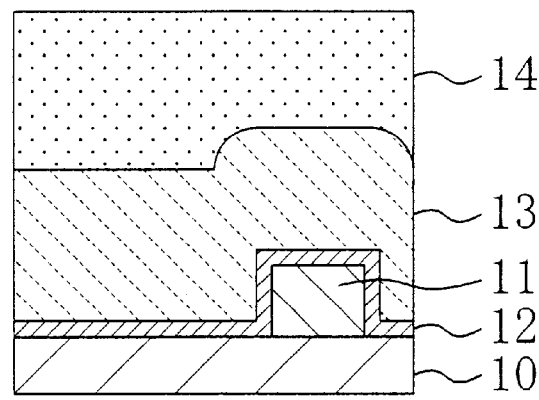
Figure 8C:
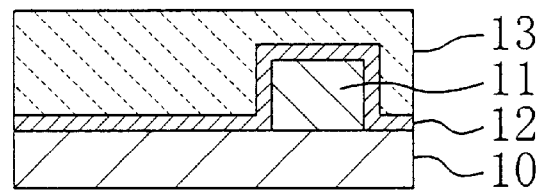
Figure 8D:
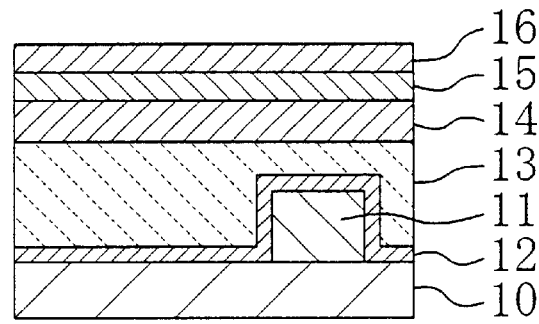
Figure 8E:
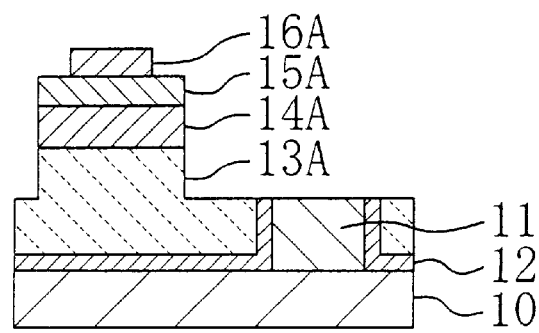
Figure 9A:
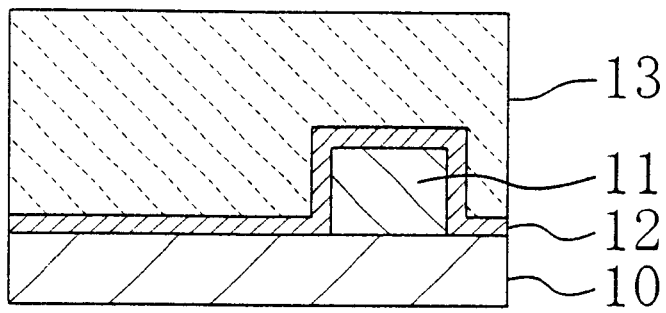
FIGS. 9(*a*), 9(*b*) and 9(*c*) are cross-sectional views illustrating respective process steps for fabricating a semiconductor device according to a second prior art example.
Figure 9B:
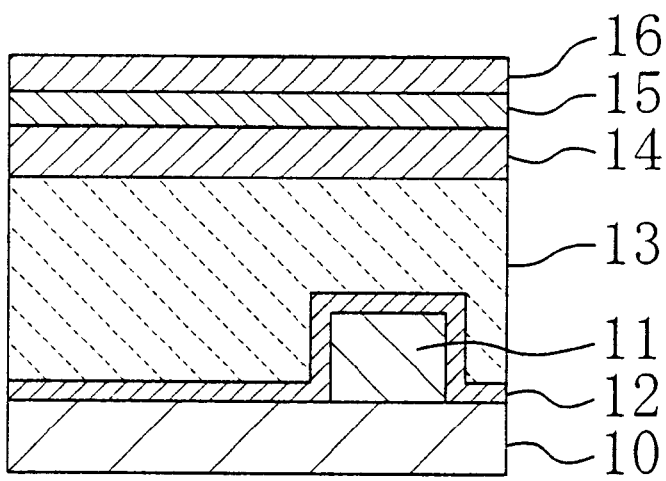
Figure 9C:
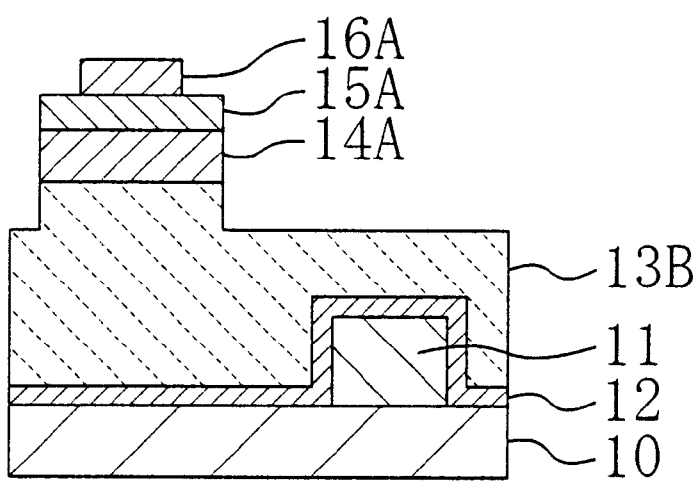

Thereafter, a mask pattern (not shown), covering a region where the capacitor has been formed, is defined to mask and selectively wet-etch the first silicon dioxide film 303 using a hydrofluoric acid solution. As a result, parts of the first silicon dioxide film 303, on which the capacitor does not exist (e.g., a part in which an MOS transistor will be formed), have their thickness reduced and the silicon nitride film 302 is partially exposed as shown in FIG. 7(c).

Subsequently, although not shown, a second silicon dioxide film is deposited to a thickness of 200 nm, for example, over the entire surface of the semiconductor substrate 300 as well as over the respective regions where the MOS transistor and the capacitor are located. Then, a contact hole is opened through respective parts of the second silicon dioxide film and the first silicon dioxide film 303, in which the MOS transistor will be formed. Thereafter, the contact hole is filled in with a conductor film, thereby forming a contact connected to the diffused region of the MOS transistor.

According to the third embodiment, the first silicon dioxide film 303 contains boron and phosphorus and can have its surface sufficiently planarized by a reflow process. Thus, the surface of the first silicon dioxide film 303 becomes sufficiently flat and is not affected so much by the unevenness of the interconnect 301 located under the first silicon dioxide film 303.

Furthermore, according to the third embodiment, the first silicon dioxide film 303 is selectively wet-etched with a hydrofluoric acid solution to reduce the thickness of the part of the first silicon dioxide film 303 in which an MOS transistor will be formed. Thus, the silicon nitride film 302 can be a wet-etch stopper, because the film 302 is not etched by hydrofluoric acid easily. As a result, the interconnect 301 will not be etched unintentionally. In the wet etching process step using hydrofluoric acid, the wet-etch rate of the first silicon dioxide film 303 is about 80 times as high as that of the silicon nitride film 302.

In the foregoing embodiments, each first silicon dioxide film 103, 203 or 303 contains both boron and phosphorus, but may contain at least one of boron and phosphorus. If either boron or phosphorus is contained, then the first silicon dioxide film 103, 203 or 303 can have its surface sufficiently planarized by a reflow process.

Also, in the foregoing embodiments, each first silicon dioxide film 103, 203 or 303 is dry-etched and etched back but may be planarized through a CMP process. In that case, the resist film 104, 204 or 304 will not be needed.

Furthermore, in the foregoing embodiments, a capacitor, including a ferroelectric film as a capacitive insulating film, is supposed to be formed as an exemplary electronic device. Alternatively, any other type of electronic device may be formed using the ferroelectric film.

What is claimed is:

1. A method for fabricating a semiconductor device, comprising the steps of:
   a) forming a pattern of electrodes or interconnects on a semiconductor substrate;
   b) depositing a wet-etching stopper over the pattern;
   c) depositing a first insulating film, which will be dry-etched at a relatively high rate and exhibit relatively high planarity, over the substrate as well as over the pattern;
   d) reducing the thickness of the first insulating film by wet-etching the first insulating film;
   e) depositing a second insulating film, which will-be dry-etched at a relatively low rate and exhibit relatively low planarity, over the first insulating film having the reduced thickness; and
   f) forming a multilayer structure, including a ferroelectric film, on the second insulating film and then dry-etching and patterning the multilayer structure, thereby forming an electronic device out of the multilayer structure.

2. The method of claim 1, further comprising the step of:
   wet-etching and removing parts of the second insulating film, on which the electronic device does not exist, after the step f) has been performed.

3. The method of claim 1, wherein the first insulating film is a first silicon dioxide film containing a dopant, and wherein the second insulating film is a second silicon dioxide film containing substantially no dopants.

4. The method of claim 1, wherein the electronic device is a capacitor including a capacitive insulating film that has been formed out of the ferroelectric film.

5. A method for fabricating a semiconductor device, comprising the steps of:
   a) forming a pattern of electrodes or interconnects on a semiconductor substrate;
   b) depositing a wet-etching stopper over the pattern;
   c) depositing a first insulating film, which will be dry-etched at a relatively high rate and exhibit relatively high planarity, over the substrate as well as over the pattern;
   d) depositing a second insulating film, which will be dry-etched at a relatively low rate and exhibit relatively low planarity, over the first insulating film;
   e) forming a multilayer structure, including a ferroelectric film, on the second insulating film and then dry-etching and patterning the multilayer structure, thereby forming an electronic device out of the multilayer structure; and
   f) wet-etching and removing parts of the second insulating film, on which the electronic not exist.

6. The method of claim 5, wherein
   first insulating film is a first silicon oxide film including impurities, and
   second insulating film is a second silicon oxide film including no substantial impurity.

7. The method of claim 5, wherein
   the electronic device is a capacitor including a capacitive insulating film that has been formed out of the ferroelectric film.

* * * * *

UNITED STATES PATENT AND TRADEMARK OFFICE
CERTIFICATE OF CORRECTION

| | | |
|---|---|---|
| PATENT NO. | : 6,624,076 B1 | Page 1 of 1 |
| APPLICATION NO. | : 09/672860 | |
| DATED | : September 23, 2003 | |
| INVENTOR(S) | : Toyoji Ito | |

It is certified that error appears in the above-identified patent and that said Letters Patent is hereby corrected as shown below:

Column 11, line 14, change "which will-be" to -- which will be --;

Column 12, line 20, change "electronic not exist" to -- electronic device does not exist --;

Column 12, line 23, change "The method of claim 5, wherein first insulating film is. . ." to -- The method of claim 5, wherein the first insulating film is -- ;

Column 12, line 25, change "second insulating film" to -- the second insulating film --;

Signed and Sealed this

Twenty-fourth Day of July, 2007

JON W. DUDAS
*Director of the United States Patent and Trademark Office*